(12) United States Patent
Hosek et al.

(10) Patent No.: US 12,528,197 B2
(45) Date of Patent: Jan. 20, 2026

(54) LINEAR ROBOT ARM WITH MULTIPLE END EFFECTORS

(71) Applicant: Persimmon Technologies Corporation, Wakefield, MA (US)

(72) Inventors: Martin Hosek, Lowell, MA (US); Dennis Poole, Derry, NH (US); Christopher Hofmeister, Hampstead, NH (US)

(73) Assignee: Persimmon Technologies Corporation, Wakefield, MA (US)

( * ) Notice: Subject to any disclaimer, the term of this patent is extended or adjusted under 35 U.S.C. 154(b) by 268 days.

(21) Appl. No.: 17/404,338

(22) Filed: Aug. 17, 2021

(65) Prior Publication Data

US 2021/0370520 A1    Dec. 2, 2021

Related U.S. Application Data

(62) Division of application No. 16/815,098, filed on Mar. 11, 2020, now Pat. No. 11,130,240, which is a division of application No. 16/444,043, filed on Jun. 18, 2019, now Pat. No. 10,596,710, which is a division of application No. 13/796,578, filed on Mar. 12, 2013, now Pat. No. 10,363,665.

(60) Provisional application No. 61/669,812, filed on Jul. 10, 2012.

(51) Int. Cl.
*H01L 21/67* (2006.01)
*B25J 11/00* (2006.01)
*H01L 21/677* (2006.01)

(52) U.S. Cl.
CPC ..... *B25J 11/0095* (2013.01); *H01L 21/67706* (2013.01); *Y10S 901/19* (2013.01)

(58) Field of Classification Search
CPC .................................................. B25J 11/0095
USPC ........................................................ 414/744.5
See application file for complete search history.

(56) References Cited

U.S. PATENT DOCUMENTS

| | | | |
|---|---|---|---|
| 5,151,008 A | 9/1992 | Ishida et al. | |
| 6,299,404 B1 | 10/2001 | Muka | |
| 6,315,512 B1* | 11/2001 | Tabrizi | H01L 21/67781 414/217 |
| 6,533,530 B1 | 3/2003 | Zenpo | |
| 7,736,118 B2 | 6/2010 | Uratani et al. | |
| 2003/0180126 A1 | 9/2003 | Poole | |
| 2007/0269302 A1 | 11/2007 | Kim | |
| 2009/0087288 A1* | 4/2009 | Hofmeister | B25J 18/00 414/222.01 |
| 2009/0143911 A1 | 6/2009 | Gage et al. | |
| 2010/0178136 A1* | 7/2010 | Ago | B25J 9/042 414/217 |
| 2010/0178147 A1* | 7/2010 | Kremerman | B25J 9/043 414/800 |
| 2012/0232690 A1 | 9/2012 | Gilchrist | |

* cited by examiner

*Primary Examiner* — Ronald P Jarrett
(74) *Attorney, Agent, or Firm* — McCarter & English LLP

(57) ABSTRACT

A substrate transport apparatus including a lower linearly driven effector structure with spaced paddles, and an upper linearly driven end effector structure with spaced paddles and no rotating joints above a paddle of the lower end effector structure. A drive subsystem is configured to linearly drive the lower end effector structure and to linearly drive the upper end effector structure independent of the lower end effector structure.

22 Claims, 12 Drawing Sheets

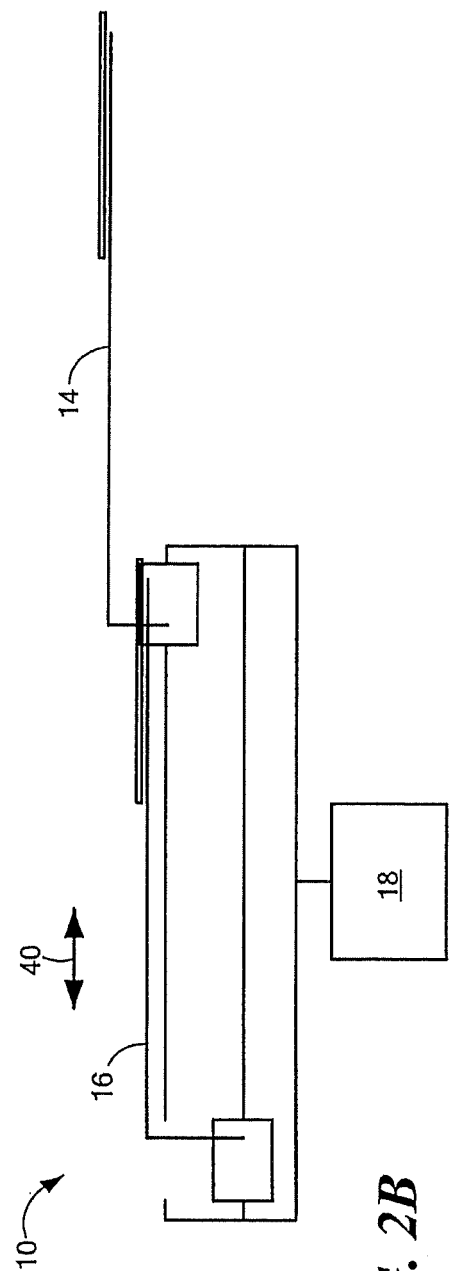
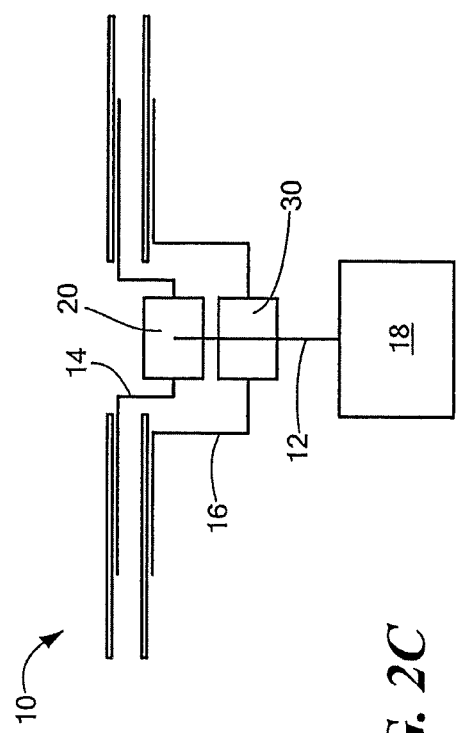

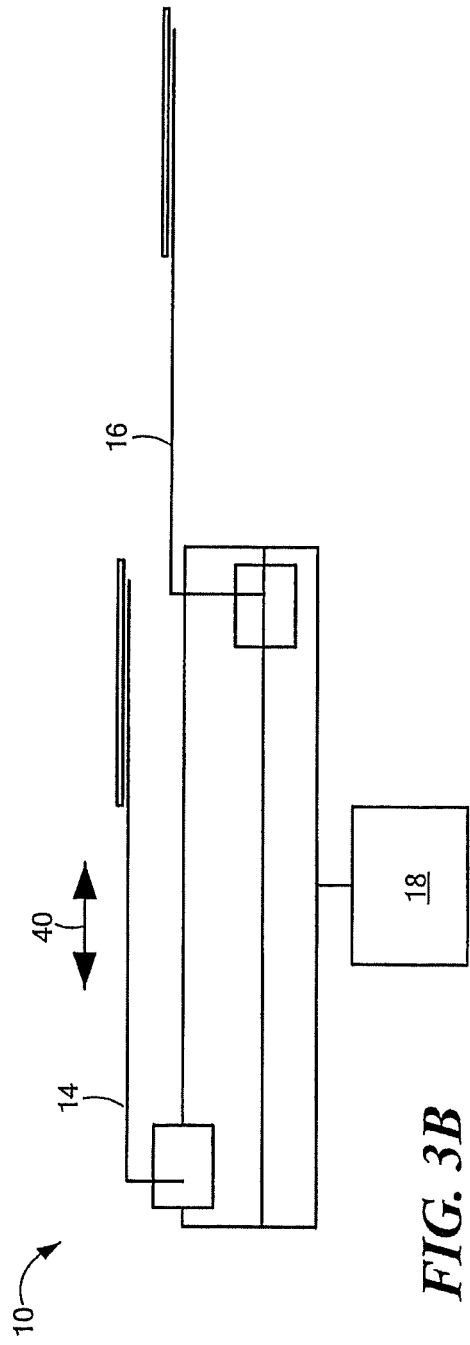
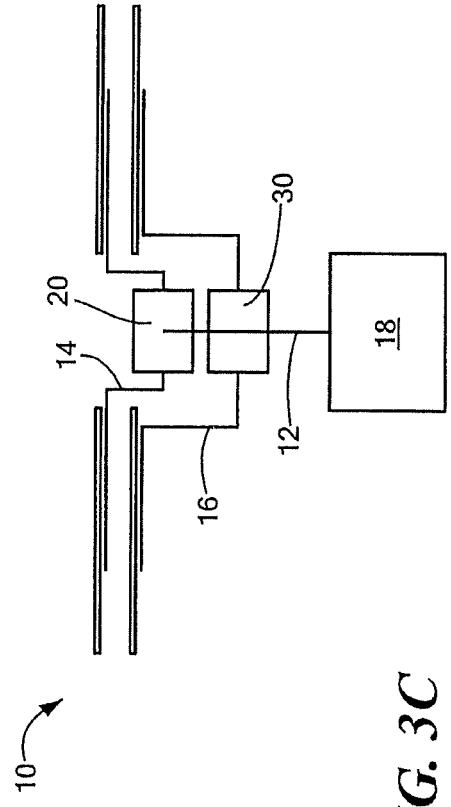
FIG. 3B
FIG. 3C

LINEAR ROBOT ARM WITH MULTIPLE END EFFECTORS

CROSS REFERENCE TO RELATED APPLICATIONS

This application is a divisional patent application of U.S. application Ser. No. 16/815,098 filed Mar. 11, 2020, which is a divisional patent application of U.S. application Ser. No. 16/444,043 filed Jun. 18, 2019, which is a divisional patent application of U.S. application Ser. No. 13/796,578 filed Mar. 12, 2013, which claims benefit of and priority to U.S. Provisional Application No. 61/669,812 filed Jul. 10, 2012 which are hereby incorporated herein by this reference in their entireties.

FIELD OF THE INVENTION

The disclosed embodiments relate to a robot having an arm with multiple end effectors and more particularly to a robot having one or more arms with multiple end effectors, each supporting two substrates.

BACKGROUND OF THE INVENTION

Vacuum, atmospheric and controlled environment processing for applications such as associated with manufacturing of semiconductor, LED, Solar, MEMS or other devices utilize robotics and other forms of automation to transport substrates and carriers associated with substrates to and from storage locations, processing locations, or other locations. Such transport of substrates may be moving individual substrates, groups of substrates with single arms transporting one or more substrates or with multiple arms, each transporting one or more substrate.

In some applications it is advantageous to transport and process more than one substrate in parallel. Here, throughput of a given tool may be increased without a proportionate increase in footprint and cost. In addition, such applications may require the ability of the transport robot to quickly swap processed substrates for unprocessed substrates at a given process module, improving utilization of the module and throughput of the system. A problem arises in such applications where four substrates (two processed, two unprocessed) are handled with a fast swap where the arms of the robot are required to pass over the substrates or where a bridge is used on one of the two substrate end effectors to allow it to pass over the other two substrate end effector. If the upper structure includes a rotational joint which passes over the lower structure and/or a wafer carried by the lower structure, contamination is possible. See U.S. Pat. No. 6,315,512 incorporated herein by this reference. A bridge associated with the upper structure can be unwieldy, cumbersome, and difficult to tune. See U.S. Pat. No. 5,151,008 incorporated herein by this reference. A substrate transport apparatus in accordance with various examples of the invention has no upper rotating joins passing over a lower wafer and a bridge is not required or needed. Accordingly, there is a desire to provide a substrate transport robot that does not require such a bridge for a given range of transport applications with minimized transport and swap times.

SUMMARY OF THE INVENTION

Featured is a substrate transport apparatus in accordance with various examples of the invention that in one preferred embodiment has no upper rotating joints passing over a lower wafer. Furthermore, in preferred embodiments, a bridge is not required or needed.

Featured is a substrate transport apparatus comprising a lower, linearly driven end effector structure with spaced paddles and also an upper, linearly driven end effector structure with spaced paddles. There are no rotating joints above a paddle of the lower end effector structure. A drive subsystem is configured to linearly drive the lower end effector structure and to linearly drive the upper end effector structure independent of the lower end effector structure.

The upper linearly driven end effector structure may include a fork member mounted to a shuttle and the drive subsystem includes means for driving the shuttle: linear bearings, magnet levitation means, a linear motor, and/or a belt arrangement. The lower linearly driven end effector structure may include a fork member mounted to a shuttle and similar means for driving the lower fork shuttle.

The substrate transport apparatus may include a support structure for the upper and lower end effectors and a rotational drive for the support structure. In one example, the support structure includes pulley mounts for linearly driving the upper and lower end effector structures via pulleys and the drive subsystem includes a shuttle secured to a belt about pulleys on the pulley mounts. The drive subsystem may include a driven pulley for each end effector belt.

In another design, the drive subsystem includes a first scara arm on a support structure and the upper linearly driven end effector structure includes a fork member attached to the first scara arm. The first scara arm may be attached to the fork member at a location between the paddles of the lower end effector. The drive subsystem may further include two scara arms mounted to the support structure driving the lower end effector structure. Preferably, these two scara arms are driven together.

Also featured is a substrate transport apparatus comprising a lower linearly driven fork with spaced paddles, an upper linearly driven fork with spaced paddles, a first shuttle for the lower fork, and a second shuttle for the upper fork. A drive subsystem is supported by a support structure and is configured to linearly drive the first shuttle and the second shuttle independent of the first shuttle.

In one example, the drive subsystem includes a linear motor. In another example, the support structure includes pulley mounts and the drive subsystem includes first and second belts about pulleys on the pulley mounts, the first and second shuttles secured to the first and second belts, respectively. In another example, the drive subsystem includes a plurality of scara arms.

Also featured is a substrate transport apparatus comprising a support structure, an upper linearly driven fork with spaced paddles, a first scara arm rotatably mounted to the support structure driving the upper fork, second and third scara arms rotatably mounted to the support structure and driven together, a first lower paddle driven by the second scara arm, and a second lower paddle driven by the third scara arm.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIGS. 2A-2C are top, side, and front views of the substrate transport apparatus of FIG. 1 showing the upper, linearly driven end effector structure extended;

FIGS. 3A-3C are top, side, and front views of the substrate transport apparatus of FIGS. 1-2 showing the lower, linearly driven end effector structure extended;

DETAILED DESCRIPTION OF THE INVENTION

Figure 1A:
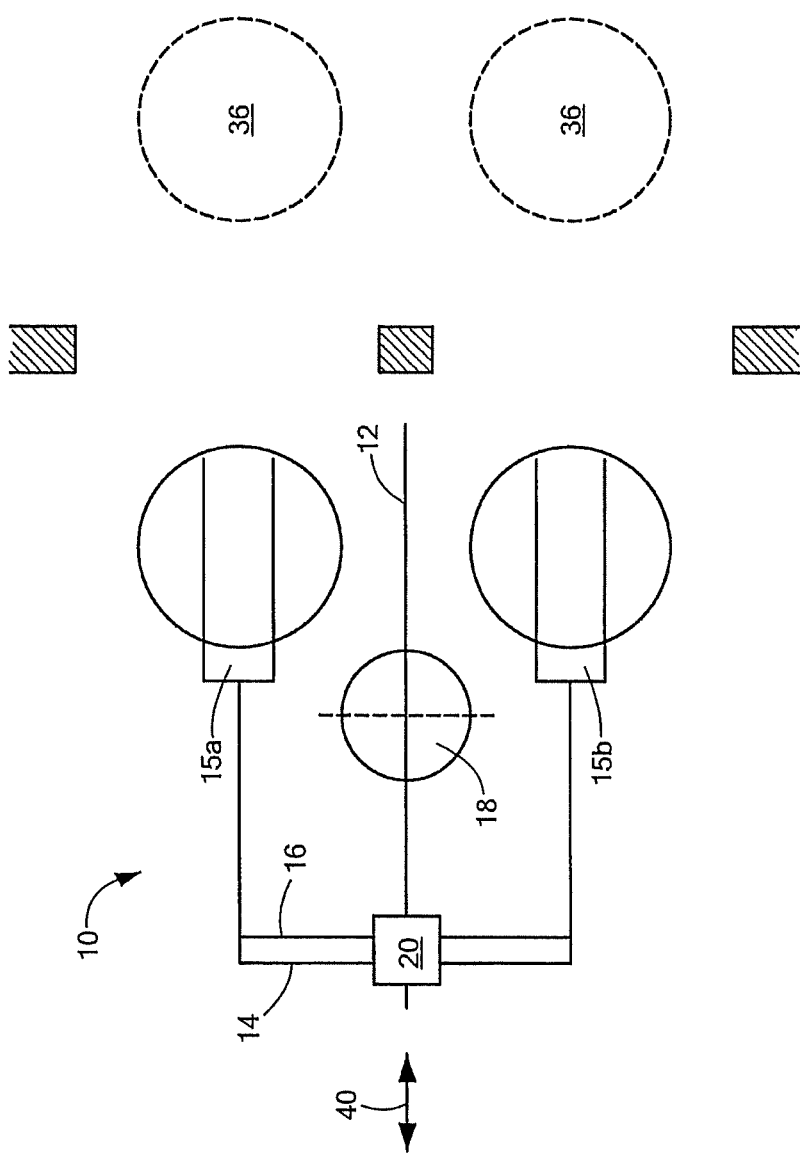
FIG. 1A is a schematic top view of an embodiment of a substrate transport apparatus in accordance with the invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Featured is a linear robot arm with multiple end-effectors which is suitable for handling semiconductor substrates in vacuum cluster tools with side-by-side workstations. Alternately any suitable substrate or tool type may be provided. Referring to FIGS. 1-2, there is shown diagrammatically the top view, side view and front view of the present robot with transport arm 10. The robot arm may include support structure 12, an upper linearly driven end effector structure or subassembly 14, a lower linearly driven end effector structure or subassembly 16, and drive module 18. The upper 14 and lower 16 movable subassemblies may be arranged so that they may move along a common direction with respect to the support structure 12. Here, as shown in FIG. 2, the upper and lower end effectors are each fork members with two prongs 22 and 24 terminating in paddles 15a and 15b for upper fork 14 and paddles 17a and 17b for lower fork 16. Each paddle carries a substrate as shown.

The upper movable subassembly 14 may be mounted to shuttle 20. The shuttle 20 may be coupled to the support structure 12 so that it may move linearly along a substantially straight line 40 with respect to the support structure 12. In the embodiment shown, the upper assembly 14 and lower assembly 16 are shown in a nested configuration to avoid interference of the respective slide and drive components. Further, the split configuration shown avoids the need for bridges that otherwise would be needed to avoid interference between one or more substrate 28, on each moveable subassembly with respect to the other. In alternate aspects and as will be described, any suitable nested geometry may be provided to support assemblies 14, 16 that avoids the use of a bridge.

The drive subsystem may include a linear motor including one or more linear bearings attached to the shuttle 20 and one or more rails connected to the support structure 12. A contactless, for instance, drive based on a magnetic levitation principle may be used. A suitable shielding or sealing arrangement, for instance, a labyrinth type of an arrangement, may be employed if a mechanical coupling is used to prevent contamination of the surrounding environment by particles potentially produced in the mechanical coupling. The shuttle may be actuated with respect to the support structure, for example, using a belt, a cable, a ball screw or any suitable actuation arrangement. The linear motor actuator may be attached to the robot arm or it may be part of an external robot drive unit coupled to the robot arm via a shaft or another suitable coupling mechanism. The support structure may include a rail and the shuttle may ride on the rail.

The upper movable subassembly 14 may include a shuttle 20, a left prong 22 and a right prong 24. The left prong 22 may be connected to the shuttle 20 on the left-hand side, and may support paddle 15a configured to carry a payload, for instance, a semiconductor substrate. The right prong 24 may be connected to the shuttle 20 on the right-hand side and may support an end-effector paddle 15b configured to carry a payload, for instance, a semiconductor substrate.

Similarly, the lower movable fork subassembly (16) may include shuttle 30, a left prong 32 and a right prong 34. The left substructure 32 may be connected to the shuttle 30 on the left-hand side, and may support an end-effector paddle 17a configured to carry a payload, for instance, a semiconductor substrate. The right substructure 34 may be connected to the shuttle 30 on the right-hand side, and may support an end-effector paddle 17b configured to carry a payload, for instance, a semiconductor substrate. Shuttle 30 may be coupled to the support structure so that it may move along a substantially straight line 40 with respect to the support structure. The direction of motion of the shuttle of the lower movable subassembly may be substantially parallel to the direction of motion of the shuttle of the upper movable subassembly.

Independent motion of the upper and lower fork structures is preferred. Note the lack of any rotating joint or possible generator of particles associated with upper fork 14 located above the substrates carried by lower fork 16.

The drive subsystem for the lower fork 16 may be configured to drive shuttle 30 utilizing a linear motor. In one version, one or more linear bearings are attached to the shuttle and one or more rails are connected to the support structure. A contactless linear motor may be based on a magnetic levitation principle. A suitable shielding or sealing arrangement, for instance, a labyrinth type of an arrangement, may be employed if a mechanical coupling is used to prevent contamination of the surrounding environment by particles potentially produced in the mechanical coupling.

The shuttle may be actuated with respect to the support structure, for example, using a belt, a cable, a ball screw or any other suitable linear actuation arrangement. The actuator may be attached to the robot arm or it may be part of an external robot drive unit coupled to the robot arm via a shaft or another suitable coupling mechanism. The support structure may include a cantilevered rail and the shuttle may be driven on the rail.

Figure 1B:
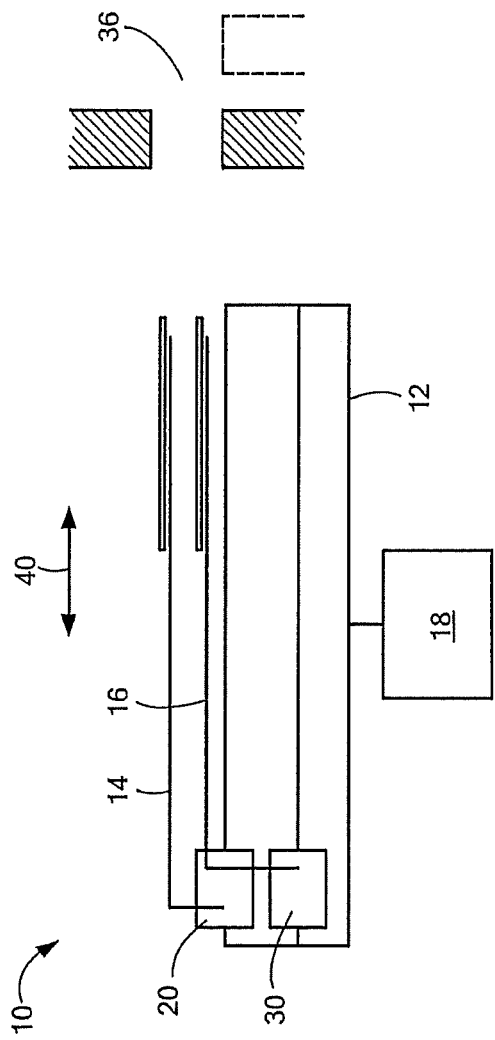
FIG. 1B is a side view of the substrate transport apparatus shown in FIG. 1A.
Figure 1C:
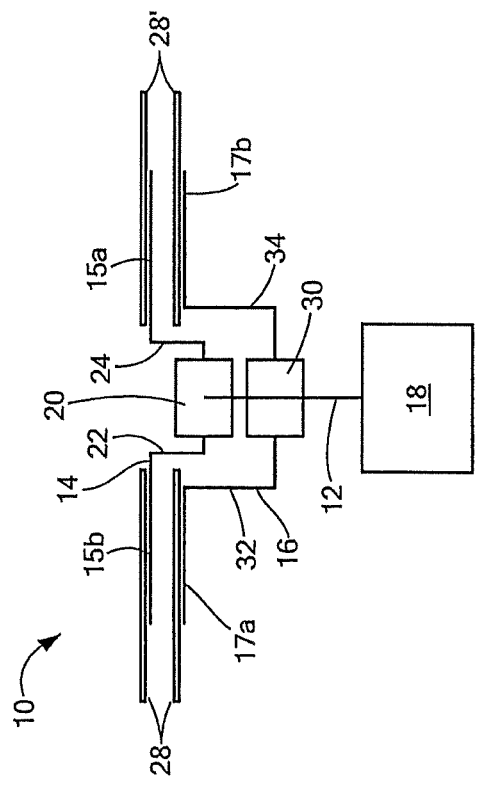
FIG. 1C is a schematic front view of the substrate transport apparatus shown in FIG. 1A.
Figure 2A:
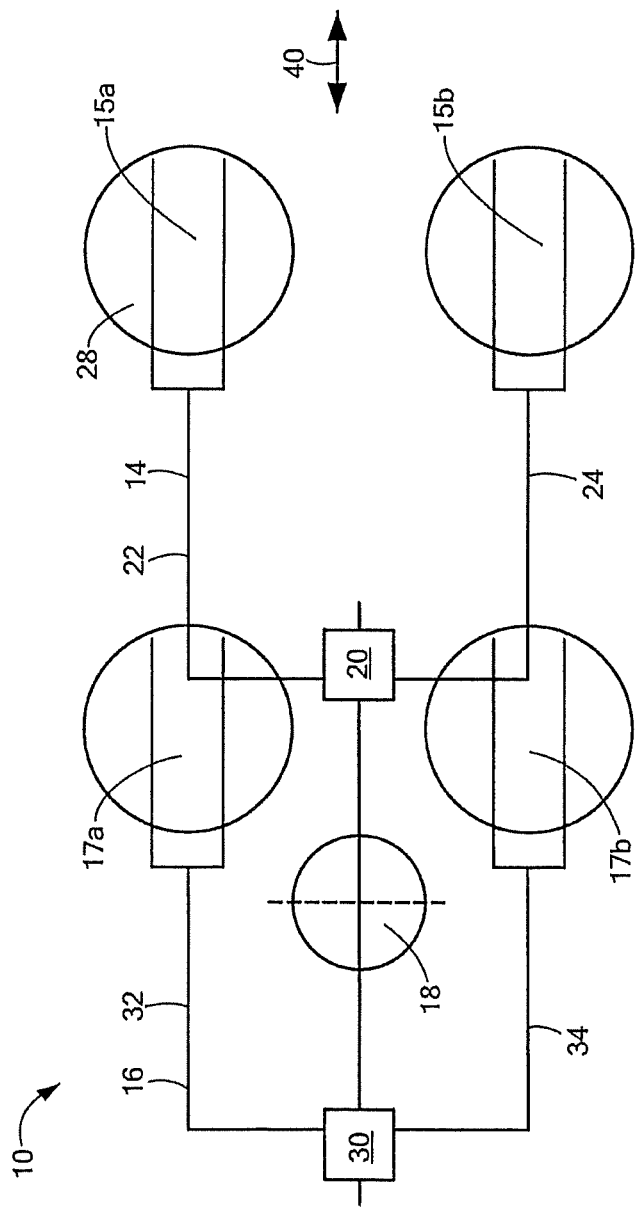

The upper movable subassembly 14 may be extended into a workstation 36, FIG. 1A to pick a pair of substrates using the end effectors paddles of the upper movable subassembly from the workstation, or place a pair of substrate paddles using the end-effectors of the upper movable subassembly onto the workstation. FIGS. 2A, 2B and 2C shows diagrammatically the upper movable subassembly in such an extended position.

Figure 3A:
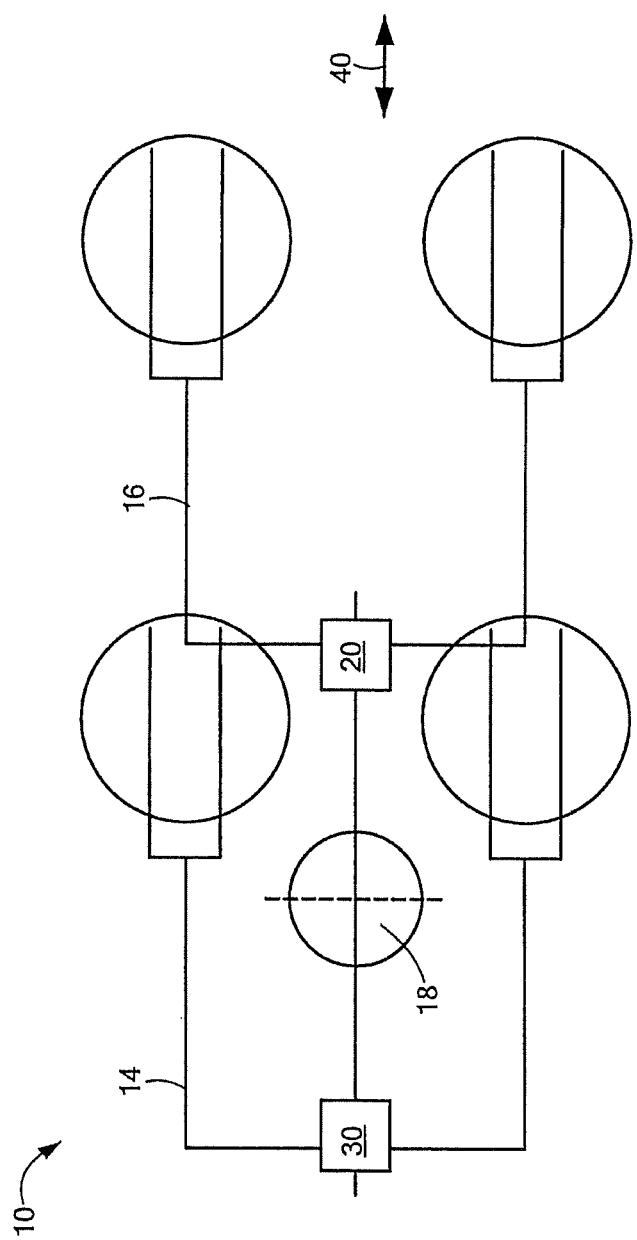

Similarly, the lower movable subassembly 16 may be extended into a workstation 36, FIG. 1A to pick a pair of substrates using the end-effectors paddles of the lower movable subassembly from the workstation, or place a pair of substrates using the end-effectors of the lower movable subassembly onto the workstation. FIGS. 3A, 3B and 3C depict the lower movable subassembly 16 in its extended position. A fast swap of a processed pair of substrates for a fresh pair of substrates may be achieved by picking the processed pair of substrates from a workstation 36, for example, by the end-effectors of the upper movable subassembly 14, and placing a pair of fresh substrates onto the workstation 36, for instance, using the end-effectors of the lower movable subassembly 16. Alternatively, the upper and lower movable subassemblies may exchange their roles in the fast swap operation.

The support structure 12 may be coupled to a rotary drive unit 18 which may be utilized to rotate the robot arm with respect to an axis of rotation substantially perpendicular to the direction of motion of the upper 14 and lower 16 movable subassemblies, for instance, to orient the robot arm toward a workstation. Furthermore, the rotary drive unit may be coupled to a vertical drive unit as seen in FIG. 4 which may be utilized to adjust the vertical position of the robot arm with respect to a workstation and pick a pair of substrates using the end-effectors of the upper or lower movable subassembly from the workstation, or place a pair of substrates using the end-effectors of the upper or lower movable subassembly onto the workstation.

This embodiment is merely exemplary. In alternate aspects, as will be described below with respect to alternate aspects of the disclosed embodiment, the slides and drive components may be packaged differently, for example, where upper end effector structure assembly 14 has slide and/or drive components on a left side of the system 10 and where lower end effector structure assembly 16 has slide and/or drive components on a right side of the system 10 with assemblies 14, 16 nested in a horizontal plane. In alternate aspects, the slides and drive components may be packaged differently, for example, where upper assembly 14 and lower assembly have slide and/or drive components on both a left and right side of the system 10 with assemblies 14, 16 nested in a horizontal plane. Further, system 10 may be configured with more than one rotary drive where, by way of example, the support structure 12 includes two separate support structures respectively for assemblies 14, 16 and where the separate support structures are driven independently by the more than one rotary drives such that they may independently access different modules. Similarly, system 10 may be configured with more than one vertical Z drive corresponding to each rotary drive where, by way of example, the support structure 12 may have two separate support structures respectively for assemblies 14, 16 and where the separate support structures are driven independently by the more than one rotary drives and vertical Z drives such that they may independently access different modules 36. Further, alternate configurations may be provided to drive shuttle portion 20, 30 either alone or in combination. By way of example, a two bar linkage may be provided (e.g., a segmented frog leg arm) respectively for each segment 14, 16 driven concentric with or offset from the rotary axis of drive 18. By way of further example, a constrained two bar linkage may be provided (e.g., 2 link partial scara linkage) respectively for each segment 14, 16 driven concentric with or offset from the rotary axis of drive 18.

Drive 18 may be any suitable vacuum compatible drive module. For example, drive 18 may be a concentric two axis rotary drive where a first of the rotary axis drives support 12 and where a second rotary axis drives both segment 14 and segment 16 independently, for example, with a linkage that substantially drives segment 14 through a first rotating portion of second rotary axis and where the linkage substantially drives segment 16 through a second rotating portion of second rotary axis. Alternately, drive 18 may be a three axis rotary drive with one or more Z drive components. For example, drive 18 may have a primary rotary axis with first and second rotary axis offset with respect the primary rotary axis where, for example, first and second rotary axis drive segment 14, 16 independently respectively on left and right sides of system 10 and where first and second rotary axis may also be driven by the Z axis and the primary rotary axis together, independently in Z or independently with respect to the primary axis. By way of further example, drive 18 may have a primary rotary axis with first and linear motor axis offset horizontally or vertically with respect the primary rotary axis where, for example, first and second rotary axis drive segment 14, 16 independently respectively on upper and lower portions or left and right sides of system 10 and where first and second linear motor axis may also be driven by one or more z axis and one or more primary rotary axis together, independently in Z or independently with respect to both or either of the one or more primary rotary axis and one or more z axis. Accordingly, all such combinations are embraced.

Figure 4:
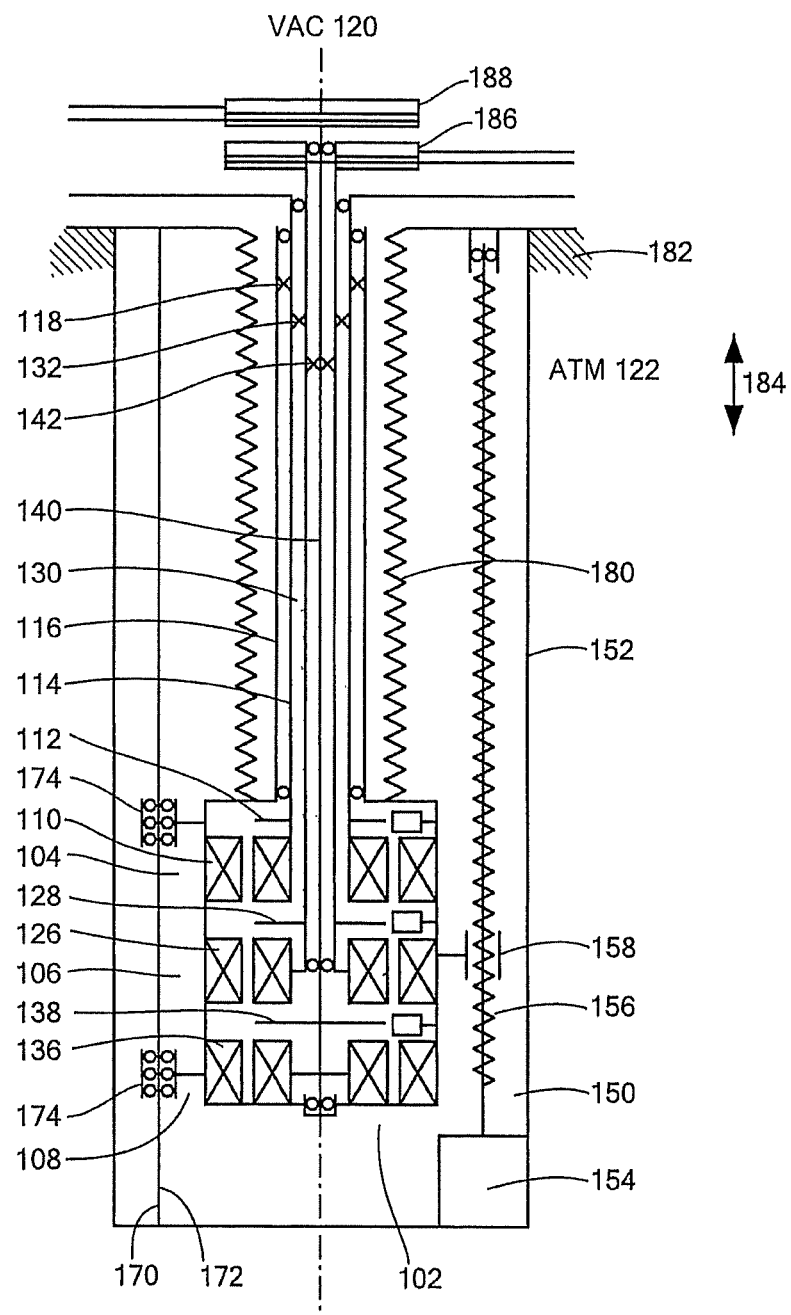
FIG. 4 is a schematic view showing an exemplary rotary drive unit in accordance with examples of the invention.

Referring now to FIG. 4, there is shown a schematic cross section of exemplary drive assembly 18. Drive assembly 18 is shown having three rotary axis and a single vertical axis. In alternate aspects, more or less axis may be provided. By way of example, in one aspect, drive 18 may be configured with a single rotary axis and a single vertical axis that may be provided and coupled to the arm support structure 12 of FIGS. 1 through 3 and operable as described. Alternately, three rotary axis and a single vertical axis may be provided to drive arms as will be described in greater detail below. Drive 18 is shown having concentric drive shafts. In alternate aspects, any suitable drive shaft or driving arrangement, parallel, linear or otherwise may be provided. Drive 18 has enclosure 102 that houses first, second and third rotary axises 104, 106 and 108 respectively. First rotary axis 104 has motor 110, encoder 112 and output shaft 114 concentrically mounted with respect to mast 116 of enclosure 102. Seal 118 may isolate a vacuum environment 120 from an atmospheric environment 122. In alternate aspects, seal 118 may not be provided, for example, where all or a portion of enclosure 102 is exposed to the vacuum environment. Second rotary axises 106 has motor 126, encoder 128 and output shaft 130 concentrically mounted with respect to shaft 114 of first rotary axis 104. Seal 132 may isolate a vacuum environment 120 from an atmospheric environment 122. In alternate aspects, seal 132 may not be provided, for example, where all or a portion of enclosure 102 is exposed to the vacuum environment third rotary axis 108 has motor 136, encoder 138 and output shaft 140 concentrically mounted with respect to shaft 130 of second rotary axis 106. Seal 142 may isolate a vacuum environment 120 from an atmospheric environment 122. In alternate aspects, seal 142 may not be provided, for example, where all or a portion of enclosure 102 is exposed to the vacuum environment. Lead screw drive 150 may be coupled to stationary frame and having motor & encoder 154, screw 156 and moveable nut assembly 158 where nut assembly 158 may be stationarily coupled to housing 102. Slides 170 may be provided having rails 172 couple to frame 152 and moveable blocks 174 stationarily coupled to housing 102. Bellows 180 may be provided coupled to housing 102, chamber 182 and/or frame 152 such that a vacuum environment 120 may be maintained isolated from and atmospheric environment 122 with an internal portion of chamber 182, bellows 180 and/or housing 102 may be exposed to the vacuum environment 120. Selective rotation of screw 156 moves housing 102 in a vertical direction 184 and with it mast 116 and shafts 114, 130, 140. In one aspect only a single rotary axis 104 may be provided, for example, coupling shaft 114 to support structure 12 of FIGS. 1-3. In alternate aspects, drive 18 may be configured to drive alternate arm configurations, for example as described below.

Figure 5:
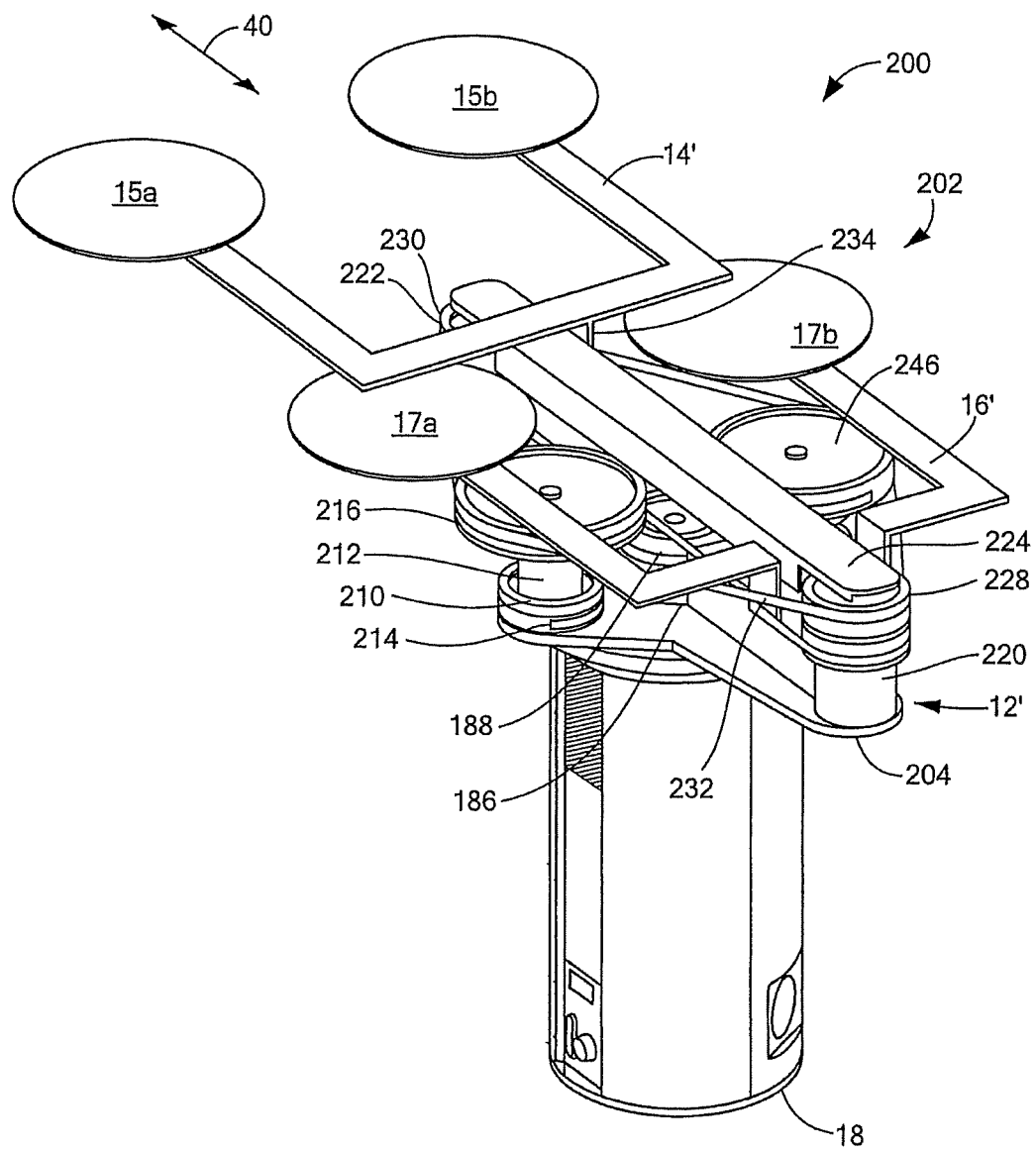
FIG. 5 is a schematic three dimensional top view showing an embodiment of a substrate transport apparatus where a driven pulley, idler pulley(s), and belt subsystem is used as the drive subsystem to linearly drive the end effector structures in accordance with an example of the invention.
Figure 6:
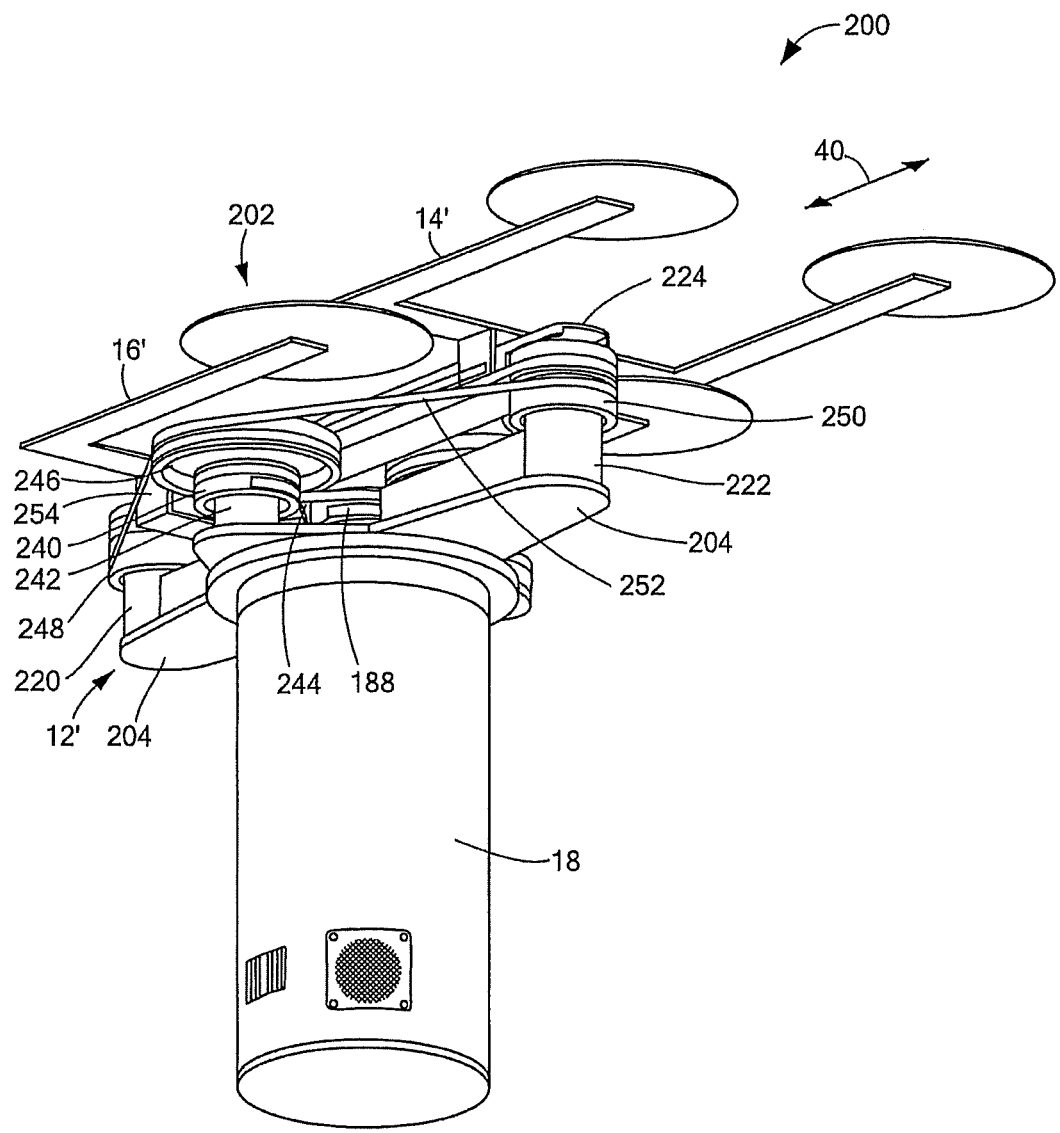
FIG. 6 is a schematic three dimensional bottom view of the substrate transport apparatus shown in FIG. 5.

Referring now to FIGS. 5 and 6, there is shown an exemplary embodiment drive subsystem 200 having features according to one embodiment. Here, a system of pulleys and bands linearly drive the upper and lower end effector structures. System 200 has robot drive 18 and arm 202 where arm 20 may have features as described or as will be described below. Arm 20 has support 12' and first and second driven segments 14' and 16' respectively. Support 12' has base 204 coupled to shaft 114, FIG. 4 of drive 18. Here, rotation of shafts 114, 130 and 140 of drive 18 together effects rotation of the arm assembly 202, FIGS. 5-6. As will be described, selectively holding shaft 114 stationary and then selectively rotating shafts 130, 140 FIG. 4 will effect radial extension and retraction of linearly driven upper and lower fork member 14' and 16' respectively, FIGS. 5-6 and as will be described. Shaft 130, FIG. 4 is coupled to pulley 186 where pulley 186 is coupled to pulley 210 of jackshaft 212 with FIG. 8 bands 214. Here, jackshaft 212 is rotatably coupled to base plate 204. Jackshaft 212 further has pulley 216 that may be a larger diameter than pulley 214. Here, rotation of pulley 186 effects opposite rotation of pulleys 210 and 216. First and second posts are coupled to base 204 and have support 224 coupled to and spanning between first and second posts 220, 222. A shuttle is provided coupling driven segment 14' to support 224.

Pulleys 228, 230 are further rotatably coupled to posts 220, 222 respectively. Band 232 is provided coupled to shuttle 234 and extending in opposing directions 40 around pulleys 228, 230 and coupled at two points on pulley 216 such that selective rotation of pulley 216 effects selective extension and retraction of driven segment 14'. Here, for example, clockwise rotation of shaft 130 effects extension of driven segment 14' whereas counter clockwise rotation of shaft 130 effects retraction of driven segment 14'.

Similarly, shaft 140 is coupled to pulley 188 where pulley 188 is coupled to pulley 240 of jackshaft 242 with figure eight bands 244. Here, jackshaft 242 is rotatably coupled to base plate 204. Jackshaft 242 further has pulley 246 that may be a larger diameter than pulley 244. Here, rotation of pulley 188 effects opposite rotation of pulleys 240 and 246. First and second posts are coupled to base 204 and have support 224 coupled to and spanning between first and second posts 220, 222. A shuttle is provided coupling driven segment 16' to support 224 or posts 220, 222. Pulleys 248, 250 are further rotatably coupled to posts 220, 222 respectively. Band 252 is provided coupled to carriage 254 and extending in opposing directions 40 around pulleys 248, 250 and coupled at two points on pulley 246 such that selective rotation of pulley 246 effects selective extension and retraction of driven segment 16'. Here, for example, clockwise rotation of shaft 140 effects extension of driven segment 16' whereas counter clockwise rotation of shaft 140 effects retraction of driven segment 16'. Here, selective rotation of shafts 130, 140 effects selective extension of driven segments 14', 16'.

Pulley 188 drives band 252 via pulleys 240, 246, 248, 250 and drives lower segment 16'. Pulley 186 drives band 232 via pulleys 210, 216, 228, 230 and drives upper segment 14'.

Figure 7A:
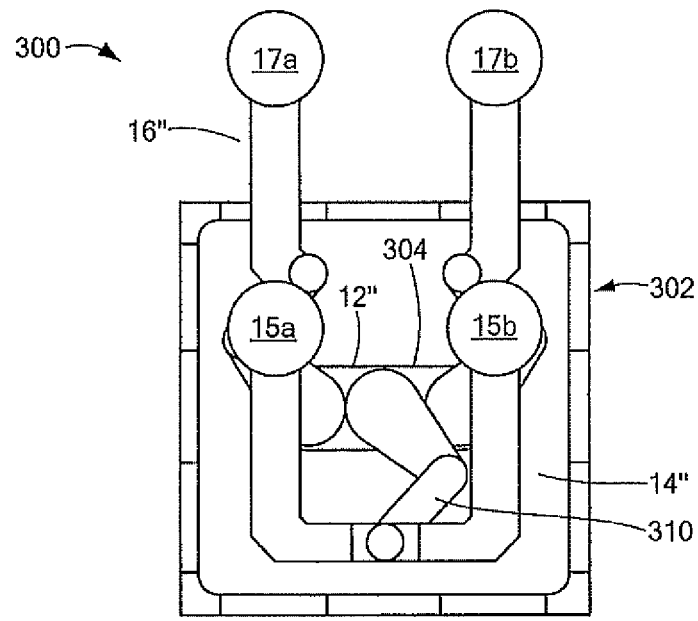
FIGS. 7A and 7B are schematic top views showing an example of a substrate transport apparatus in accordance with an example of the invention where scara arms are used as the drive subsystem to linearly drive the upper and lower end effector structures.
Figure 7B:
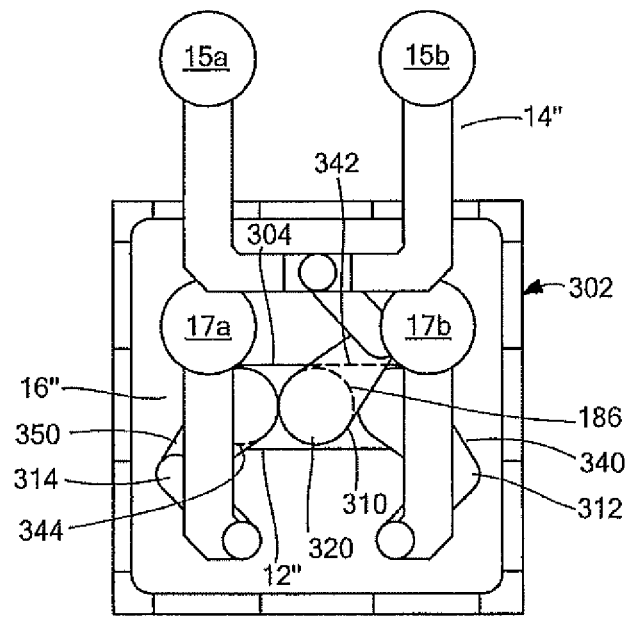

Referring now to FIGS. 7A and 7B, there is shown an exemplary embodiment of another drive system 300 having features according to the disclosed embodiment. System 300 has robot drive 18 and arm 302 where arm 302 may have features as described or as will be described below. Arm 302 has support 12" and first and second driven end effector segment 14" and 16" respectively. Support 12" has base 304 coupled to shaft 114 of drive 18. Here, rotation of shafts 114, 130 and 140 FIG. 4 of drive 18 together effects rotation of the arm assembly 302. As will be described, selectively holding shaft 114 stationary and then selectively rotating shafts 130, 140 will effect radial extension and retraction of driven segments 14" and 16" respectively and as will be described. Shaft 140 selectively drives inner scara arm 310 FIG. 7 while shaft 130 selectively drives opposing scara arms 312, 314 as will be described. Here shaft 140 is coupled to upper arm 320 of scara arm 310 with a shoulder pulley (not shown) of scara arm 310 grounded to base 304 such that counterclockwise rotation of shaft 140 effects extension of arm 310 and clockwise rotation of shaft 140 effects retraction of arm 310. Shaft 130 selectively drives opposing scara arms 312, 314 simultaneously as will be described. Here shaft 130 is coupled to upper arm 340 of scara arm 312 by a 1:1 pulley drive 342 with a shoulder pulley (not shown) of scara arm 312 grounded to base 304 such that counterclockwise rotation of shaft 130 effects extension of arm 312 and clockwise rotation of shaft 130 effects retraction of arm 312. Similarly shaft 130 is coupled to upper arm 350 of scara arm 314 by a ~1:1 FIG. 8 pulley drive 344 with a shoulder pulley (not shown) of scara arm 314 grounded to base 304 such that counterclockwise rotation of shaft 130 effects extension of arm 314 and clockwise rotation of shaft 130 effects retraction of arm 314. Here, scara arm 310 may be nested within scara arm 312 as shown in elevation. Here, selective rotation of shafts 130, 140 effects selective extension of driven segments 14", 16". The driven segment 14" forms an upper fork which is coupled to scara arm 310 at a location between paddles 17a and 17b of the driven segment 16" or lower linearly driven end effector structure 16".

Figure 8A:
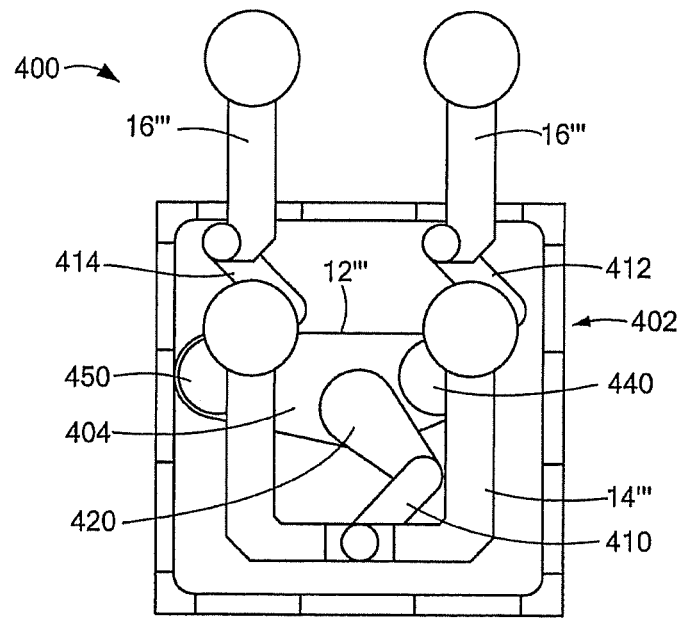
FIGS. 8A and 8B are schematic top views showing another example of a substrate transport apparatus where scara arms are used in the drive subsystem to linearly translate the upper and lower end effector structures.
Figure 8B:
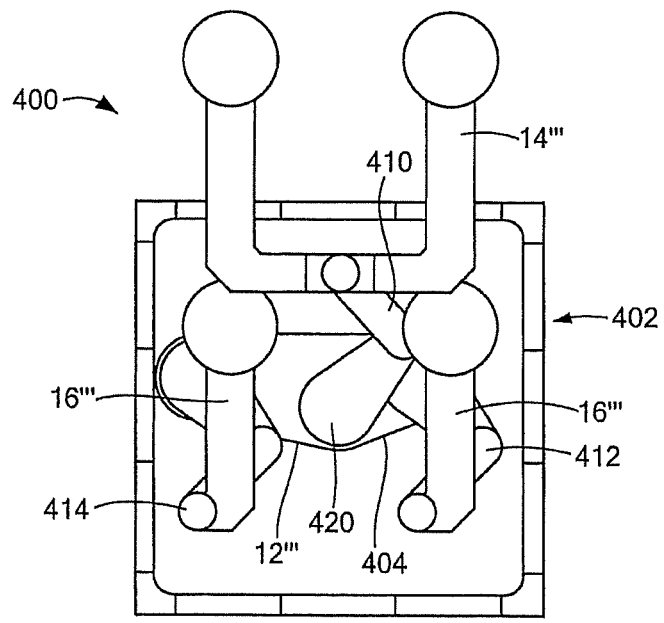
Figure 9A:
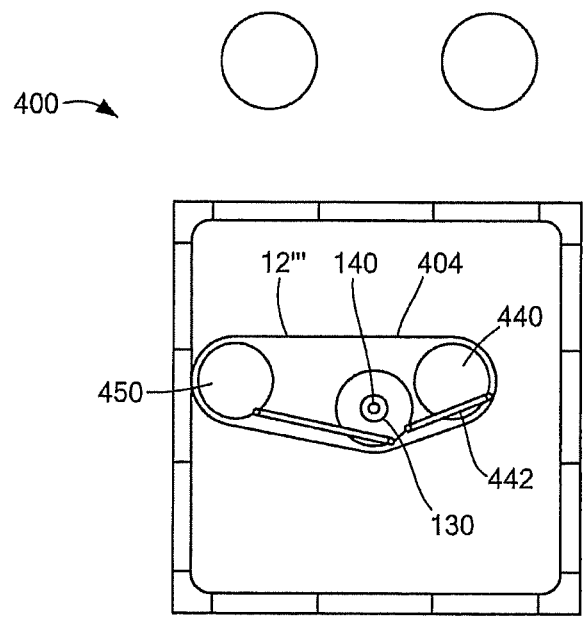
FIGS. 9A and 9B are top views of the apparatus show in FIG. 8A showing more clearly the support structure thereof and the bases of the scara arms rotatably coupled thereto.
Figure 9B:
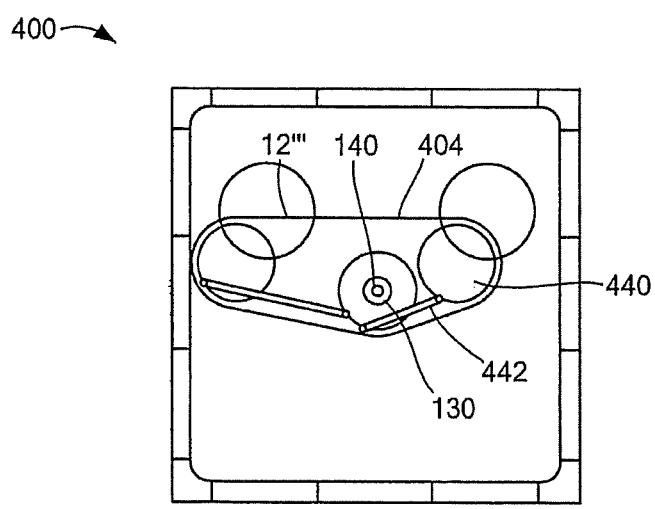

Referring now to FIGS. 8 and 9, there is shown an exemplary embodiment drive system 400 having features according to the disclosed embodiment. System 400 has robot drive 18 and arm 402 where arm 402 may have features as described or as will be described below. Arm 402 has support 12'" and first and second driven segments 14'" and 16'" respectively. Support 12'" has base 404 coupled to shaft 114 of drive 18. Here, rotation of shafts 114, 130 and 140, FIG. 4 of drive 18 together effects rotation of the arm assembly 402.

As will be described, selectively holding shaft 114 stationary and then selectively rotating shafts 130, 140 will effect radial extension and retraction of driven segments 14''' and 16''' respectively and as will be described. Shaft 140 selectively drives inner scara arm 410 while shaft 130 selectively drives opposing scara arms 412, 414 as will be described. Here shaft 140 is coupled to upper arm 420 of scara arm 410, FIGS. 8-9 with a shoulder pulley (not shown) of scara arm 410 grounded to base 404 such that counterclockwise rotation of shaft 140 effects extension of arm 410 and clockwise rotation of shaft 140 effects retraction of arm 410. Shaft 130 selectively drives opposing scara arms 412, 414 simultaneously as will be described. Here shaft 130 is coupled to upper arm 440 of scara arm 412 by a link 442, FIG. 9 with a shoulder pulley (not shown) of scara arm 412 grounded to base 404 such that counterclockwise rotation of shaft 130 effects extension of arm 412 and clockwise rotation of shaft 130 effects retraction of arm 412. Similarly shaft 130 is coupled to upper arm 450 of scara arm 414 by link 444 with a shoulder pulley (not shown) of scara arm 414 grounded to base 404 such that counterclockwise rotation of shaft 130 effects extension of arm 414 and clockwise rotation of shaft 130 effects retraction of arm 414. Here, scara arm 410 may be nested within scara arm 412 as shown in elevation. Here, selective rotation of shafts 130, 140 effects selective extension of driven segments 14''', 16'''.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A substrate transport apparatus comprising:
a first shuttle, where the first shuttle comprises a first scara arm;
a first end effector coupled to the first shuttle, where the first end effector comprises a first section configured to carry a first substrate and a second section configured to carry a second substrate, where the second section is laterally spaced from the first section;
a second shuttle, where the second shuttle comprises two second scara arms;
at least one second end effector coupled to the second shuttle, where the at least one second end effector comprises a third section configured to carry a third substrate and a fourth section configured to carry a fourth substrate, where the fourth section is laterally spaced from the third section; and
a drive coupled to the first and second shuttles, where the drive comprises a first coaxial drive shaft connected to the first shuttle and a second coaxial drive shaft connected to the two second scara arms of the second shuttle, where the drive is configured to move the first and second shuttles to linearly move the first and second end effectors, where the drive and the first and second shuttles are configured to linearly move the at least one second end effector independent from movement of the first end effector.

2. The substrate transport apparatus of claim 1 where the first end effector comprises a first fork member mounted to the first shuttle, where the first fork member comprises left and right prongs.

3. The substrate transport apparatus of claim 2 where the drive comprises means for moving the second shuttle.

4. The substrate transport apparatus of claim 2 where the at least one second end effector comprises a second fork member mounted to the second shuttle, where the second fork member comprises left and right prongs.

5. The substrate transport apparatus of claim 4 where the drive comprises means for moving the first shuttle.

6. The substrate transport apparatus of claim 1 further comprising a support structure connected to the first and second end effectors.

7. The substrate transport apparatus of claim 6 further comprising a rotational drive connected to the support structure.

8. The substrate transport apparatus of claim 6 where the support structure comprises pulley mounts and pulleys on the pulley mounts for linearly driving the first and second end effectors.

9. The substrate transport apparatus of claim 8 where the drive comprises the first and second shuttles being secured to at least one belt about the pulleys on the pulley mounts.

10. The substrate transport apparatus of claim 9 where the drive comprises at least one driven pulley for the at least one belt.

11. The substrate transport apparatus of claim 1 where the first scara arm is on a support structure, where the first end effector comprises a first fork member attached to the first scara arm, and where the first fork member comprises left and right prongs.

12. The substrate transport apparatus of claim 11 where the first scara arm is attached to the first fork member at a location between the first and second sections of the first end effector.

13. The substrate transport apparatus of claim 12 where the two second scara arms are mounted to the support structure, where the at least one second end effector comprises two members, where a first one of the members having the third section is connected to a first one of the second scara arms and a second one of the members having the fourth section is connected to a second one of the second scara arms.

14. The substrate transport apparatus of claim 13 in which the two second scara arms are configured to be driven together.

15. A substrate transport apparatus comprising:
a first shuttle comprising a first scara arm;
a first end effector coupled to the first shuttle, where the first end effector comprises a first section configured to carry a first substrate and a second section configured to carry a second substrate, where the second section is laterally spaced from the first section;

a second shuttle comprising a second scara arm and a third scara arm;

a second end effector coupled to the second scara arm, where the second end effector comprises a third section configured to carry a third substrate;

a third end effector coupled to the third scara arm, where the third end effector comprises a fourth section configured to carry a fourth substrate, where the fourth section is laterally spaced from the third section; and a drive coupled to the first and second shuttles, where the drive is configured to move the first and second shuttles to linearly move the first, second and third end effectors, where the drive and the first and second shuttles are configured to linearly move the first, second and third end effectors with the second and third end effectors being moved independently relative to movement of the first end effector, where the drive comprises a first coaxial drive shaft connected to the first scara arm and a second coaxial drive shaft connected to the second and third scara arms, and where the first scara arm is attached to a first fork member of the first end effector at a location between the first and second sections of the first end effector.

16. The substrate transport apparatus of claim 15 where the second and third end effectors are in a substantially same horizontal plane and, in retracted positions, the second and third end effectors are in a stacked configuration relative to the first end effector.

17. The substrate transport apparatus of claim 16 in which the second and third scara arms are configured to be driven together by the second coaxial drive shaft.

18. The substrate transport apparatus of claim 15 wherein the first scara arm is rotatably connected to a support structure of the drive at a first location, where the second and third scara arms are rotatably mounted to the support structure at respective second and third locations, and where the first location is located between the second and third locations.

19. A substrate transport apparatus comprising:

a first shuttle, where the first shuttle comprises a first scara arm mounted to a support structure;

a first end effector coupled to the first scara arm;

a second shuttle, where the second shuttle comprises two second scara arms mounted to the support structure;

a second end effector coupled to a first one of the second scara arms;

a third end effector coupled to a second one of the second scara arms; and a drive coupled to the first and second shuttles, where the drive is configured to move the first and second shuttles to linearly move the end effectors, where the drive and the first and second shuttles are configured to linearly move the second and third end effectors independent from movement of the first end effector, where the first scara arm is rotatably connected to the support structure at a first location, where the two second scara arms are rotatably mounted to the support structure at respective second and third locations with respective axes of rotation on opposite sides of the first location, and where the first location is located between the second and third locations.

20. The substrate transport apparatus as claimed in claim 19 where the first end effector comprises a first section configured to carry a first substrate and a second section configured to carry a second substrate, where the second section is laterally spaced from the first section, where the first end effector comprises a first fork member attached to the first scara arm, and where the first fork member comprises left and right prongs.

21. The substrate transport apparatus as claimed in claim 19 where motors of the drive are configured to rotate the two second scara arms in unison.

22. The substrate transport apparatus as claimed in claim 19 where the drive comprises motors and coaxial drive shafts, where the coaxial drive shafts comprise a first coaxial drive shaft connected to the first scara arm and a second coaxial drive shaft connected to the second and third scara arms.

* * * * *